United States Patent
Tsao et al.

(10) Patent No.: US 6,607,942 B1
(45) Date of Patent: Aug. 19, 2003

(54) METHOD OF FABRICATING AS GROOVED HEAT SPREADER FOR STRESS REDUCTION IN AN IC PACKAGE

(75) Inventors: Pei-Haw Tsao, Taichung (TW); Jones Wang, Junghe (TW); Ken Chen, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/912,739

(22) Filed: Jul. 26, 2001

(51) Int. Cl.$^7$ .......................... H01L 21/48; H01L 23/34
(52) U.S. Cl. .................. 438/122; 438/125; 257/707; 257/713; 257/717; 257/720; 361/704; 361/710; 361/711
(58) Field of Search .................. 438/106, 108, 438/118, 119, 121, 122, 125, FOR 413; 257/678, 706, 707, 712, 713, 717, 719, 720, 737, 738, 778, 779, 780, 782, 783; 361/688, 703, 704, 709, 702, 707, 710, 711, 717, 718

(56) References Cited

U.S. PATENT DOCUMENTS

| | | | |
|---|---|---|---|
| 5,484,959 A | 1/1996 | Burns | 174/524 |
| 5,866,943 A * | 2/1999 | Mertol | 257/712 |
| 5,905,633 A | 5/1999 | Shim et al. | 361/704 |
| 5,949,137 A | 9/1999 | Domadia et al. | 257/712 |
| 6,011,304 A | 1/2000 | Mertol | 257/706 |
| 6,046,498 A * | 4/2000 | Yoshikawa | 257/706 |
| 6,117,352 A | 9/2000 | Weaver et al. | 216/105 |
| 6,158,502 A | 12/2000 | Thomas | 165/104.26 |
| 6,175,497 B1 * | 1/2001 | Tseng et al. | 361/704 |
| 6,437,438 B1 * | 8/2002 | Braasch | 257/712 |

FOREIGN PATENT DOCUMENTS

GB    2246472    *   8/1991

* cited by examiner

*Primary Examiner*—David L. Talbott
*Assistant Examiner*—Alonzo Chambliss
(74) *Attorney, Agent, or Firm*—George O. Saile; Stephen B. Ackerman

(57) ABSTRACT

A new design is provided for the heat spreader of a semiconductor package. Grooves are provided in a surface of the heat spreader, subdividing the heat spreader for purposes of stress distribution into four or more sections. This division of the heat spreader results in a reduction of the mechanical and thermal stress that is introduced by the heat spreader into the device package. Mechanical and heat stress, using conventional heat spreader designs, has a negative, stress induced, effect on the semiconductor die, on the contact points (bump joints) of the semiconductor die and on the solder ball connections of the package.

12 Claims, 4 Drawing Sheets

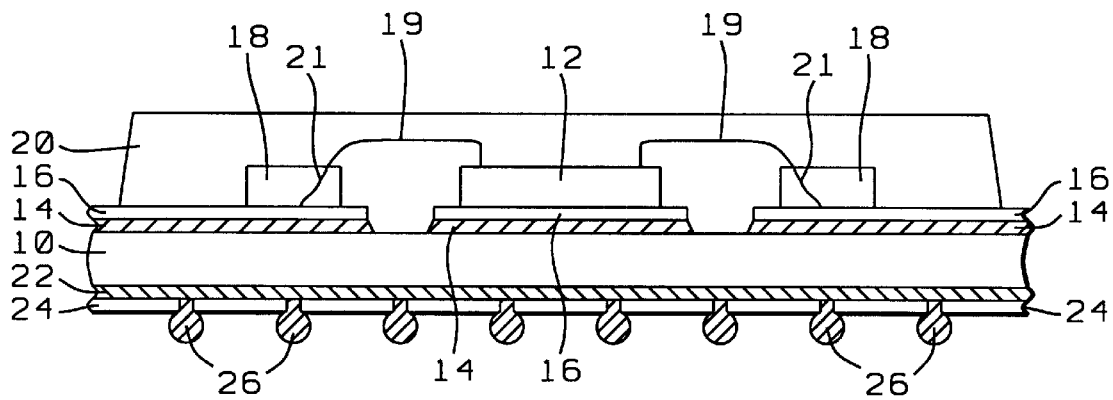
FIG. 1 – Prior Art
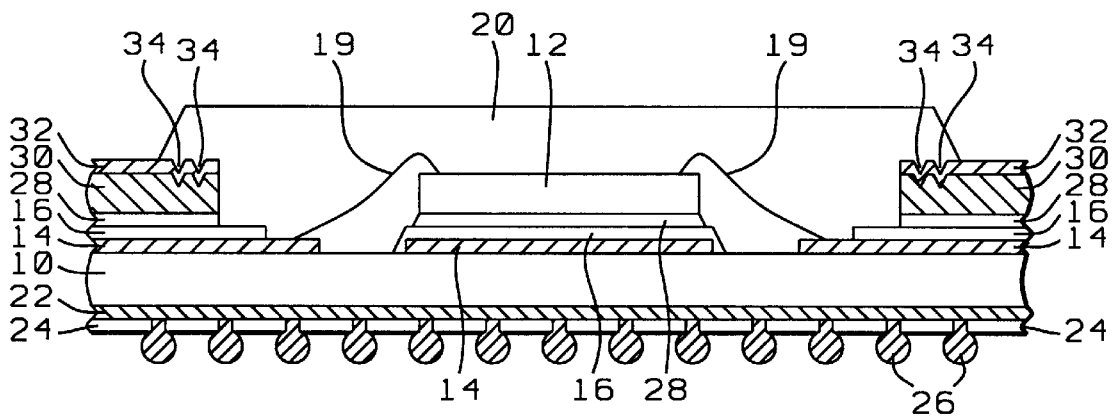
FIG. 2 – Prior Art

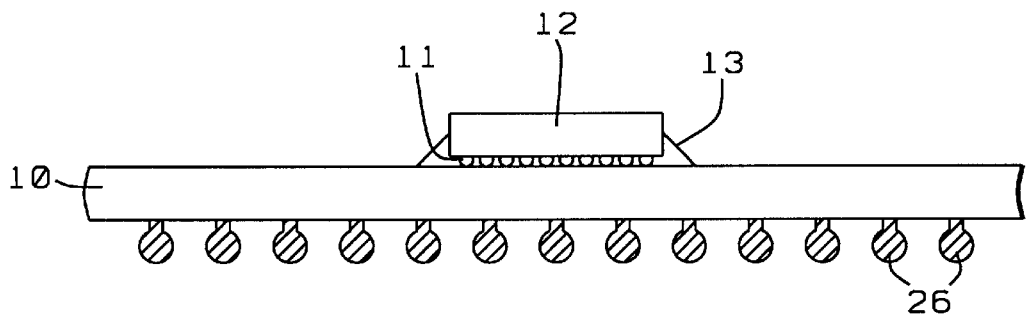
FIG. 3a – Prior Art
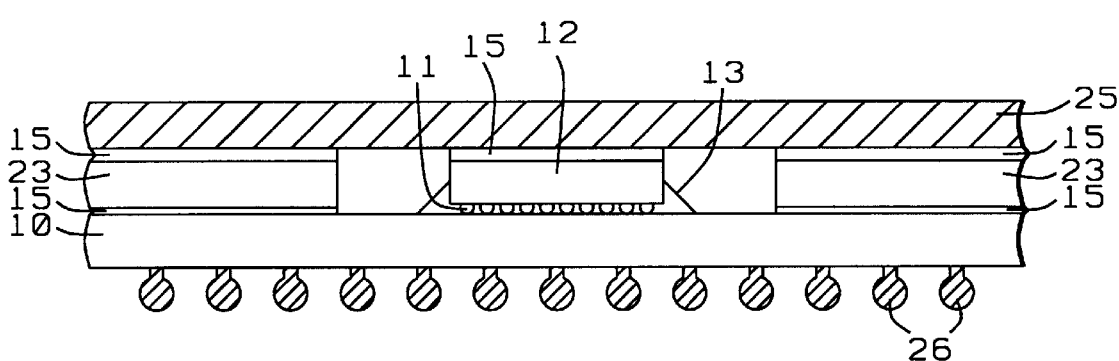
FIG. 3b – Prior Art
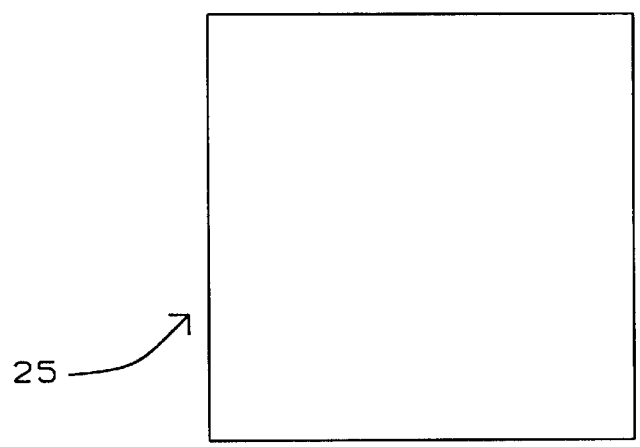
FIG. 3c – Prior Art

METHOD OF FABRICATING AS GROOVED HEAT SPREADER FOR STRESS REDUCTION IN AN IC PACKAGE

BACKGROUND OF THE INVENTION (1) Field of the Invention

The invention relates to the fabrication of integrated circuit devices, and more particularly, to a method and package that provides reduced surface and internal stress in the packaging medium.

(2) Description of the Prior Art

Semiconductor devices are typically produced by simultaneously creating a large number of identical integrated circuit (IC) devices (also referred to as semiconductor die or simply as die) in or on the surface of a semiconductor substrate in arrays of rectangular elements. Electrical access is provided to the individual die by providing contact pads, also referred to as Input/Output (I/O) pads, on the surface of the die. The I/O pads are further connected to elements within the die by means of interconnect metal that is used as signal lines, ground planes and power lines.

The process of packaging semiconductor devices typically starts with a leadframe of a substrate that is ceramic or plastic based, such as Dual-In-Line packages (DIP), Pin Grid Arrays (PGA), Plastic Leaded Chip Carriers (PLCC), Quad Flat Packages (QFP) and Ball Grid Array (BGA) packages.

The Quad Flat Package (QFP) has been created to achieve high pin count integrated packages with various pin configurations. The pin Input/Output (I/O) connections for these packages are typically established by closely spaced leads distributed along the four edges of the flat package. This limits the I/O count of the packages and therefore the usefulness of the QFP. The Ball Grid Array (BGA) package has been created whereby the I/O connects for the package are distributed around the periphery of the package and over the complete bottom of the package. The BGA package can therefore support more I/O points and provides a more desirable package for high circuit density with high I/O count. The BGA contact points are solder balls that in addition facilitate the process of flow soldering of the package onto a printed circuit board. The solder balls can be mounted in an array configuration and can use 40, 50 and 60 mil spacings in a regular or staggered pattern.

Another packaging concept is realized with the use of so-called flip chips. The flip chip is a semiconductor device that has conductive layers formed on its top surface. The top surface of the flip chip is further provided with so-called solder bumps. At the time of assembly of the flip chip, the chip is turned over (flipped over) so that the solder bumps are now facing downwards and toward the circuit board, typically a printed circuit board, on which the flip chip is to be mounted.

The invention addresses the aspect of a semiconductor device package that contains a heat spreader, the design of the heat spreader of the invention is such that stress is significantly reduced in surfaces of the package.

U.S. Pat. No. 5,905,633 (Shirn et al.) shows a heat spreader with grooves 68.

U.S. Pat. No. 6,158,502 (Thomas) shows a heat spreader with grooves, this reference differs from the invention.

U.S. Pat. No. 6,117,352 (Weaver et al. shows an etched heat spreader.

U.S. Pat. No. 6,011,304 (Mertol), U.S. Pat. No. 5,949,137 (Dornadia et al.), U.S. Pat. No. 5,484,959 (Burns) show related heat spreaders.

SUMMARY OF THE INVENTION

A principle objective of the invention is to provide a semiconductor device package comprising a heat spreader, whereby the design of the heat spreader is such that stress is significantly reduced in surfaces of the package.

In accordance with the objectives of the invention a new design is provided for the heat spreader of a semiconductor package. Grooves are provided in a surface of the heat spreader, subdividing the heat spreader for purposes of stress distribution into multiple sections. This division of the heat spreader results in a reduction of the mechanical and thermal stress that is introduced by the heat spreader into the device package. Mechanical and thermal stress, using conventional heat spreader designs, has a negative, stress induced effect on the semiconductor die, on the contact points (bump joints) of the semiconductor die and on the solder ball connections of the package.

BRIEF DESCRIPTION OF THE DRAWINGS

FIG. 1 shows a cross section of a first prior art semiconductor package.

FIG. 2 shows a cross section of a second prior art semiconductor package.

FIGS. 3a through 3c show simplified cross sections and the heat spreader of a third prior art semiconductor package, this package best compares with the package of the invention, as follows:

FIG. 3a shows a cross section where the semiconductor die is mounted on the surface of a PCB, FIG. 3b shows a cross section after the stiffener and a heat spreader have been attached, FIG. 3c shows a bottom view of the heat spreader.

DESCRIPTION OF THE PREFERRED EMBODIMENTS

Figure 4A:
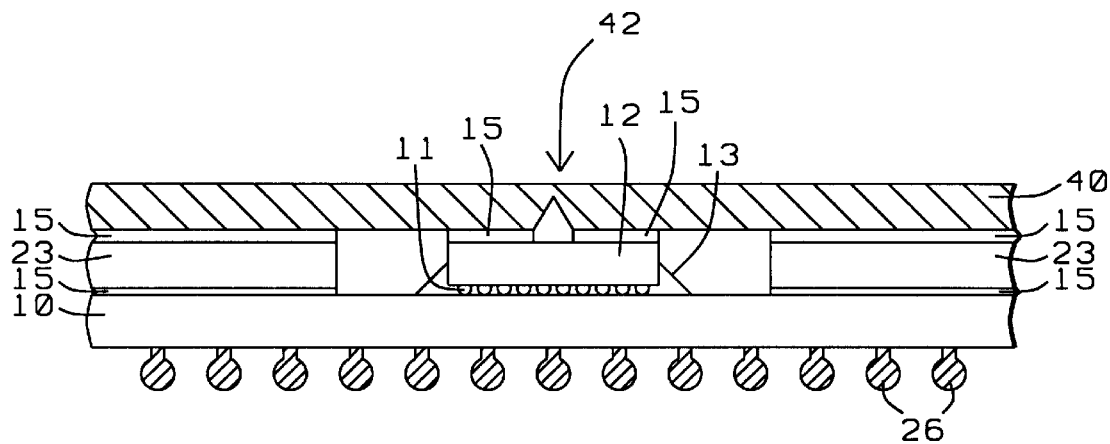
FIGS. 4a and 4b show cross sections of the package of the invention.

FIG. 1 shows a cross section of a prior art package. The elements that are highlighted in FIG. 1 are the following:

10, a Printed Circuit Board (PCB) on the surface of which a semiconductor die is mounted

12, a semiconductor die

14, a layer of metal traces (interconnect lines) that is used for interconnect distribution

16, a solder resist layer that protects the surface of the layer 14 of interconnect traces

18, a dielectric interconnect substrate containing interconnect traces; an opening has been created in the interconnect substrate, the die 12 is placed inside this opening; this interconnect substrate can take forms others than the form that is shown in cross section in FIG. 1 such as single strips and the like; the number of layers of interconnect traces contained within the interconnect substrate is also not determinate

19, bond wires that connect contact points (not shown) on the top surface of die 12 with contact points (not shown) that have been provided in the top surface of the interconnect substrate 18

20, an encapsulant the encapsulates die 12, the interconnects 19 and the interconnect substrate 18

21, an (symbolic and representative) interconnect between contact points (not shown) on the top surface of interconnect substrate 18 and contact points (not shown) on the bottom surface of the interconnect substrate 18

22, a layer of interconnect traces that is provided over the bottom surface of PCB 10
24, a solder mask overlying the interconnect traces 22, openings have been created in the solder mask 24 which expose points of electrical contact (not shown) of the interconnect traces 22
26, contact balls that have been inserted into the solder mask 22 and that make electrical contact with points of contact (not shown) of the interconnect traces 22.

FIG. 2 shows a cross section of a second prior art semiconductor package, this cross section is based on U.S. Pat. No. 5,905,633 (Shim et al.) and is introduced in order to (at a later time) highlight differences between the instant invention and the Shim et al. invention.

While element 10 has been described above as being a Printed Circuit Board, it must be realized that this element is not limited to being a Printed circuit Board but can be a flex circuit or a metallized or glass substrate or semiconductor device mounting support.

Highlighted in cross section shown in FIG. 2 are the following elements of the semiconductor package:
10, a Printed Circuit Board (PCB) on the surface of which a semiconductor die is mounted
12, a semiconductor die
14, a layer of metal traces (interconnect lines) that is used for interconnect distribution
16, a solder resist layer that protects the surface of the layer 14 of interconnect traces
19, bond wires that connect contact points on the top surface of die 12 with contact points that have been provided in the top surface of the interconnect traces 14
20, an encapsulant the encapsulates die 12
22, a layer of interconnect traces the is provided over the bottom surface of PCB 10
24, a solder mask overlying the interconnect traces 22, openings have been created in the solder mask 24 which expose points of electrical contact (not shown) of the interconnect traces 22
26, contact balls that have been inserted into the solder mask 22 and that make electrical contact with points of contact (not shown) of the interconnect traces 22
28, a bonding agent that has been deposited over the surface of layer 16 of solder resist; this bonding mask forms the interconnection between the solder resist 16 and the overlying carrier/heat spreader 30
30, the heat spreader of the package; this elements is also referred to as a PCB carrier which refers to the method that is used to assembly (multiple) packages of which one is shown in cross section in FIG. 2
32, a protective layer, typically comprising, according to Shim et al., silver, nickel or paladium; this layer is to prevent oxidation and corrosion of the metal carrier 30
34, grooves that are formed in a surface of the metal carrier 30; these grooves have, according to Shim et al., preferably a V-shaped cross section.

It must be noted from the cross section that is shown in FIG. 2 that the heat spreader (heat sink) 30 is directly attached to the package PCB 10, with intervening layers 14, 16 and 28. Furthermore, the heat sink 30 surrounds the wire bond die 12 and is partially covered by molding compound 20. The functions of grooves 34, FIG. 2, is to provide improved adhesion between the mold compound 20 and the underlying layer 28 of bonding agent by means of improved mechanical interlocking and by extending the moisture penetration path, enhancing the package reliability.

Referring now specifically to the FIGS. 3a through 3c, FIG. 3a shows the following prior art elements:
10, a substrate such as a PCB on the surface of which a semiconductor die is mounted
12, a semiconductor die
11, solder bumps that have been provided on a surface of die 12 for electrical interconnection of die 12
13, underfill that has been inserted underneath the die 12 and that surrounds the solder bumps 11, and
26, contact balls.

FIG. 3b shows in cross section, in addition to the elements that have already been highlighted under the cross section of FIG. 3a, the following prior art elements:
15, layers of adhesive that have been deposited over the surface of substrate 10, over the surface of stiffeners 23 and over the surface of semiconductor die 12
23, stiffeners of the package
25, the heat spreader of the package.

FIG. 3c shows a bottom view of the heat spreader of the package. This bottom surface of the heat spreader that is shown in top view in FIG. 3c is the surface that interfaces with the adhesive layer 15 that has been deposited over the surface of substrate 10, over the surface of stiffeners 25 and over the surface of semiconductor die 12, this surface therefore faces semiconductor die 12.

For the cross sections that are shown in FIGS. 3a through 3c, that is a typical flip-chip BGA (FC-BGA) package, the IC chip 12 is electrically connected with package substrate 10 by solder bumps 11. The underfill 13 (FIG. 3a) is applied, which fills the gap between chip 12 and the substrate 10 and is cured at temperature above room temperature to increase the bump-joint reliability.

In order to meet demands of thermal performance of a high performance IC package, the stiffener 23 (FIG. 3b) and heat spreader 25 (FIG. 3b) are attached as shown in cross section in FIG. 3b. The stiffener 23 is a plain metal plate with a proper opening in the center to allow chip placement and to provide support for the heat spreader attachment. The heat spreader 25 is a plain metal plate, FIG. 3c, and provides heat dissipation for the die 12. The disadvantages of the implementation of the heat spreader as shown in FIGS. 3a and 3b is that thermal and mechanical stresses are increased in the die 12, in solder bump 11 points of contact and in the points of contact of contact balls 26. These stresses have a negative effect on the package integrity and degrade bump-joint reliability. The invention addresses these problems.

Figure 4B:
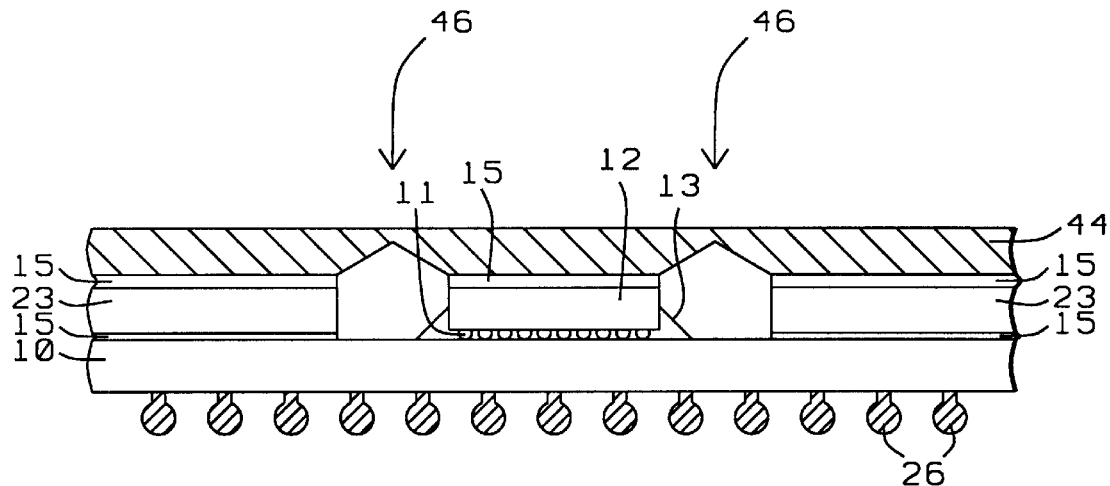
Figure 4C:
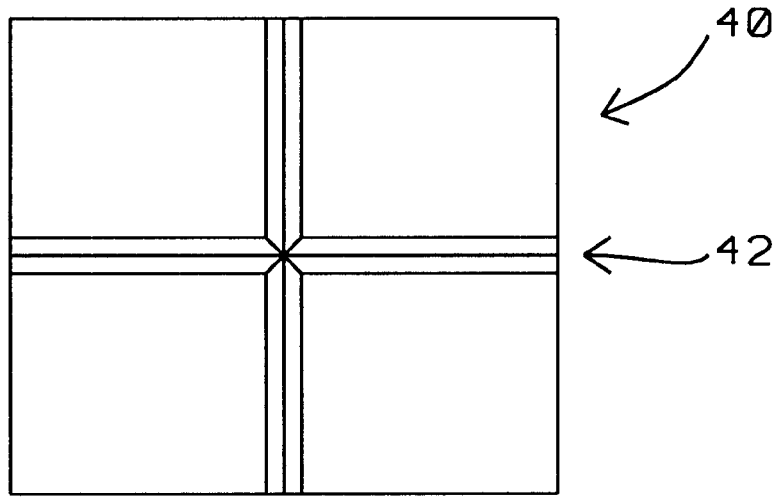
FIGS. 4c and 4d show top views of the heat spreader of the invention.
Figure 4D:
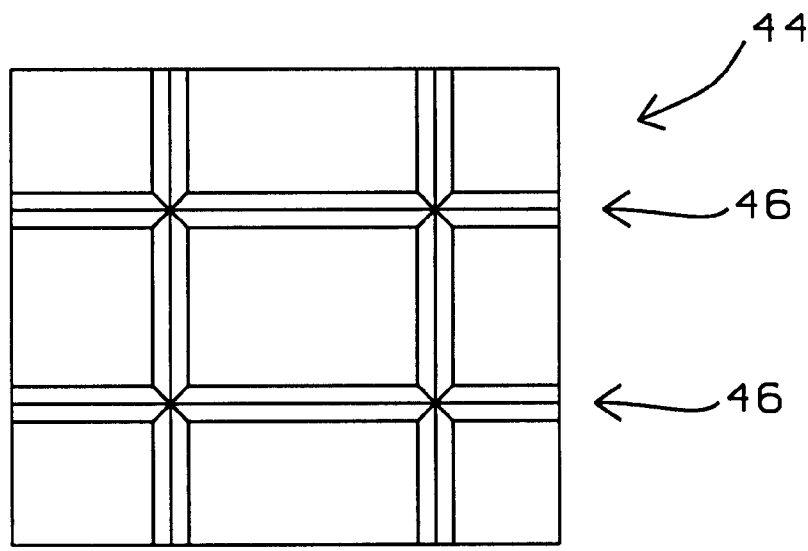

Referring now specifically to FIGS. 4a through 4d, FIG. 4a shows in cross section the package of the invention with heat spreader 40 in which grooves 42 have been provided. The grooves divide the heat spreader 40 into a number of sections, determined by the number of grooves that are provided in a surface of heat spreader 40. For the example of heat spreader 40 that is shown in top view in FIG. 4c, two grooves 42 are provided dividing the heat spreader into four sections. For the example of heat spreader 44 that is show in top view in FIG. 4d, four grooves 46 are provided dividing the heat spreader into nine sections. This dividing of the heat spreader results in the separate sections of the heat spreader functioning in an almost independent manner, whereby the typical stresses that occur in the surface of the heat spreader are now diverted to the (regions of) the grooves. In concentrating thermal and mechanical stresses from across the surface of the heat spreader to the regions of the grooves of the heat spreader, these stresses are greatly reduced in the surface of the semiconductor die 12, the solder bumps 11 and the contact-balls 26. This placement of the stress in the regions of the grooves results in enhanced reliability performance of the semiconductor die 12 and the underlying substrate 10 on which the die is mounted. In addition, thermal and mechanical stress will be reduced on points of electrical contact that are used to interconnect die 12 such as the solder bumps 11 and the contact balls 26. Since the number of grooves that is provided in the surface of the heat spreader is limited, no significant amount of material of the heat sink is removed which results in little or no negative impact on the thermal performance of the package. Grooves 42 and 46 can be created using methods of etching, machining or punching of the surface of the heat spreader.

To summarize the heat shield of the invention:

the heat spreader of the semiconductor device package is provided with grooves in the surface that faces the semiconductor die to which the heat spreader is attached the location of the grooves that are provided in a surface of the heat spreader is selected such that an optimum level of stress concentration is provided in the regions of the grooves, thus providing stress relieve across the surface of the heat spreader the heat spreader of the invention provides a method for concentrating thermal and mechanical stress into well defined regions of the heat spreader; thermal and mechanical stress in prior art heat spreaders is typically present uniformly distributed across the largest surface of a heat spreader and as such exerts stress across the largest surface of the die to which the heat spreader is attached, and the heat spreader of the invention can be provided with one or more grooves, preferably two or four perpendicularly intersecting grooves that divide the surface of the heat spreader in which the grooves have been provided in equal segments.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of applying a heat spreader in a semiconductor package, comprising the steps of:

providing a semiconductor die;

providing a substrate over the surface of which the semiconductor device is to be mounted;

providing a stiffener for the semiconductor package;

mounting the semiconductor device over the substrate, providing an adhesive interface for the stiffener, placing the stiffener in position and establishing electrical contact between the semiconductor device and the substrate; providing a heat spreader having a first and a second surface for a semiconductor package, the heat spreader having been provided with at least one groove across said heat spreader;

providing an adhesive interface for the heat spreader; and placing the heat spreader over the adhesive interface to allow direct physical contact with die thereby reducing the stress on solder ball connections between the semiconductor die and the substrate.

2. The method of claim 1, said heat spreader being a rectangular cube having parallel first and second surfaces of equal surface area bounded by four interconnecting surfaces, a surface area of said interconnecting surfaces being smaller than the surface area of said first and second surfaces by an amount, the first surface of said heat spreader facing the semiconductor die after mounting said die in the semiconductor package of which said heat spreader is an integral part.

3. The method of claim 1 wherein said at least one groove comprises two grooves provided at distances from side boundaries of said first surface, said two grooves intersecting.

4. The method of claim 1 wherein said at least one groove comprises four grooves, a first and a second of said four grooves intersecting a third and a fourth of said four grooves, said first and said second of said four grooves being provided at a distance from first side boundaries of said first surface, said third and said fourth of said four grooves being provided at a distance from second side boundaries of said first surface.

5. The method of claim 1 wherein said at least one groove comprises a multiplicity of grooves, a first half of said multiplicity of grooves intersecting a second half of said multiplicity of grooves, said first half of said multiplicity of grooves being provided at distances from first side boundaries of said first surface, said second half of said multiplicity of grooves being provided at distances from second side boundaries of said first surface.

6. The method of claim 1 wherein said providing at least one groove across said first surface of said heat spreader comprises using methods of etching or machining or punching of the first surface of the heat spreader.

7. A method of creating a semiconductor package, comprising the steps of:

providing a semiconductor device mounting support, said semiconductor device mounting support having a first and a second surface, first points of electrical contact having been provided in said first surface of said semiconductor device mounting support, second points of electrical contact having been provided in said second surface, one or more layers of interconnect lines having been provided in said semiconductor device mounting support or on the first or second surface of said semiconductor device mounting support;

providing a semiconductor device, said semiconductor device having been provided with points of electrical contact in a first surface of said semiconductor device;

positioning said semiconductor device above the second surface of said semiconductor device mounting support, said first surface of said semiconductor device facing said second surface of said semiconductor device mounting support, aligning and establishing contact between said points of electrical contact provided in said first surface of said semiconductor device and said points of electrical contact provided in said second surface of said semiconductor device mounting support;

establishing electrical continuity between said points of electrical contact provided in said first surface of said semiconductor device and said points of electrical contact provided in said second surface of said semiconductor device mounting support by a reflow of said points of electrical contact provided in the first surface of said semiconductor device;

providing an underfill for said semiconductor device, leaving a second surface of said semiconductor device exposed;

applying a first adhesive layer over the second surface area of the said semiconductor device mounting support that is not being covered by said underfill;

providing a semiconductor device stiffener having a first and a second surface, said stiffener having been provided with an opening penetrating from said first to said second surface of said stiffener and of adequate size for insertion of said semiconductor device;

positioning said stiffener over the first adhesive layer applied over the second surface of said semiconductor device mounting support, said first surface of said stiffener facing said first adhesive layer, said opening provided in said stiffener being aligned with said semiconductor device mounted on the second surface of said semiconductor device mounting support, said stiffener making contact with said first adhesive layer to allow direct physical contact with die thereby reducing the stress on solder ball connections between the semiconductor die and the substrate;

applying a second adhesive layer over the second surface of said semiconductor device and the second surface of said stiffener;

providing a heat spreader having a first and a second surface, said first surface of said heat spreader having been provided with a pattern of grooves, said pattern of grooves comprising at least one groove dividing the surface area of said first surface in sections;

positioning the first surface of said heat spreader over the surface of said second adhesive layer;

providing said first surface of said semiconductor device mounting support with a solder mask, openings in said solder mask exposing said contact points provided in said first surface of said semiconductor device mounting support;

inserting solder balls into said openings provided in said solder mask; and establishing electrical continuity between said solder balls inserted in said openings in said solder mask and said contact points provided in said first surface of said semiconductor device mounting support by a process of reflow.

8. The method of claim 7 wherein said semiconductor device mounting support is selected from the group consisting of a Printed Circuit Board and a metallized structure and a glass substrate.

9. The method of claim 7 wherein said pattern of grooves comprises two grooves provided at distances from side boundaries of said first surface.

10. The method of claim 7 wherein said pattern of grooves comprises four grooves, a first and a second of said four grooves intersecting a third and a fourth of said four grooves, said first and said second of said four grooves being provided at distances from first side boundaries of said first surface, said third and said fourth of said four grooves being provided at distances from second side boundaries of said first surface.

11. The method of claim 7 wherein said pattern of grooves comprises a multiplicity of grooves, a first half of said multiplicity of grooves intersecting a second half of said multiplicity of grooves, said first half of said multiplicity of grooves being provided at distances from first side boundaries of said first surface, said second half of said multiplicity of grooves being provided at distances from second side boundaries of said first surface.

12. The method of claim 7 wherein said pattern of grooves is provided across said first surface of said heat spreader comprises using methods of etching or machining or punching of the first surface of the heat spreader.

\* \* \* \* \*

UNITED STATES PATENT AND TRADEMARK OFFICE
CERTIFICATE OF CORRECTION

PATENT NO. : 6,607,942 B1
DATED : August 19, 2003
INVENTOR(S) : Pei-Haw Tsao, Chung Yu Jones Wang and Chih-Chiang Ken Chen It is certified that error appears in the above-identified patent and that said Letters Patent is hereby corrected as shown below:

Title Page
Item [75], Inventors, delete "Jones Wang", and replace with -- Chung Yu Jones Wang -- and delete "Ken Chen" and replace with --Chih Chiang Ken Chen --.

Signed and Sealed this

Twenty-fifth Day of May, 2004

JON W. DUDAS
*Acting Director of the United States Patent and Trademark Office*